United States Patent [19]

Buck et al.

[11] 4,193,023

[45] Mar. 11, 1980

[54] ELECTRONIC MONITORING SYSTEM WITH LOW ENERGY CONSUMPTION IN QUIESCENT STATE

[76] Inventors: Robert Buck, Kirchbuhlweg 128, Neukirch, Fed. Rep. of Germany, 7995; Gerd Marhofer, Beckmannsbusch 67, Essen-Bredeney, Fed. Rep. of Germany, 4300

[21] Appl. No.: 887,832

[22] Filed: Mar. 17, 1978

[30] Foreign Application Priority Data

Mar. 18, 1977 [DE] Fed. Rep. of Germany ....... 2711877

[51] Int. Cl.² ........................................... H01H 36/00
[52] U.S. Cl. ................................. 323/19; 307/252 P; 328/5; 361/180
[58] Field of Search ............ 307/252 A, 252 J, 252 P; 323/19, 22 SC, 38; 328/5; 340/551, 561, 562, 686; 361/179–181

[56] References Cited

U.S. PATENT DOCUMENTS

| 3,213,351 | 10/1965 | Walker | 323/22 SC |
| 3,932,803 | 1/1976 | Buck | 323/19 |
| 3,935,542 | 1/1976 | Buck | 328/5 |
| 4,117,393 | 9/1978 | Buck | 307/252 J |

Primary Examiner—A. D. Pellinen

Attorney, Agent, or Firm—Karl F. Ross

[57] ABSTRACT

A contactless motion detector, such as an oscillator sensitive to an approaching metallic element, is connected across a storage capacitor which can be charged from a source of pulsating direct current through a constant-current unit whose current flow is throttled when the charging voltage of the capacitor reaches a predetermined level. A thyristor connected across the series combination of storage capacitor and constant-current unit has a gate connected to a tap on a voltage divider lying in parallel with the capacitor so as to fire when the capacitor voltage rises substantially above the aforementioned level in order to break down a Zener diode forming part of that divider. Such a rise occurs when a transistor, inserted between the capacitor and a higher-voltage output of the constant-current unit, is turned on by a switching transistor responsive to a trigger signal from the detector. Untimely firing of the thyristor due to voltage fluctuations in the supply circuit can be prevented by an ancillary transistor, responsive to the same trigger signal, which normally either cuts off a protective transistor between the capacitor and the thyristor gate or establishes a shunt path in parallel with the voltage divider and the storage capacitor.

10 Claims, 4 Drawing Figures

4,193,023

ELECTRONIC MONITORING SYSTEM WITH LOW ENERGY CONSUMPTION IN QUIESCENT STATE

FIELD OF THE INVENTION

Our present invention relate to an electronic monitoring system, as used for example in a proximity sensor, wherein a preferably contactless detector, sensitive to an ambient condition, generates an output signal which varies with a change in that condition, e.g. with the approach of a metallic element, to increase (or decrease) the current flow through a load designed to indicate such change.

BACKGROUND OF THE INVENTION

Such a monitoring system has been described in a number of prior U.S. Pat. granted to one of us, Robert Buck, namely Nos. 3,747,010, 3,747,011, 3,747,012, 3,919,661, 3,932,774, 3,932,803 and 3,935,542. As particularly disclosed in U.S. Pat. No. 3,932,803, the contactless motion detector may comprise an oscillator and an associated trigger amplifier whose energizing circuit includes a storage capacitor which is charged via a two-conductor supply network from a source of pulsating direct current by way of a constant-current unit in parallel with the anode/cathode path of an output thyristor acting as a voltage-controlled variable-impedance means. In one embodiment of the system described and claimed in the latter patent, the output thyristor and the constant-current device lie in series with an ancillary thyristor which shunts the storage capacitor and is separated therefrom by a decoupling diode. When the output thyristor is triggered by a signal from the oscillator, the ancillary thyristor is fired through a Zener diode inserted between its anode and its gate; thus, the two series-connected thyristors conduct simultaneously in series with a load such as a relay whose operated (or unoperated) state indicates an abnormal condition, e.g. the fact that the oscillator has detected the approach of a metallic element.

Though the system just described operates generally satisfactorily, a drawback resides in the fact that the load is energized through a resistance representing the sum of the resistances of the two series-connected thyristors in their conductive state. To eliminate this drawback, copending application Ser. No. 782,400 filed 29 Mar. 1977 by Robert Buck (now U.S. Pat. No. 4,110,678) discloses an improved system in which the resistance in serise with the load is still further reduced in its high-current phase to increase the sensitivity of the system.

According to that improvement there is provided a first electronic control device having a pair of main electrodes respectively tied to the leads of the supply network and further having an input electrode, or gate, connected to one of its main electrodes (i.e. its anode if that control device is a thyristor or similar binary electronic switch such as a triac) through an operating circuit which includes a second electronic control device with input connections to the detector for changing the conductivity of the first control device in response to variations in the output signal of that detector, thereby modifying the energization of the load. Thus, the current flow through the load in a state of high conductivity of the first control device is limited practically exclusively by the resistance of that one device (aside from the internal resistance of the current source which preferably, as in the systems of the prior patents, includes a full-wave rectifier). The active component of the detector need not be an oscillator but could be an impedance bridge, a field plate or any of a variety of electromagnetic, photoelectric or other transducers responding to a predetermined change of an external condition to be monitored.

The storage capacitor insuring the continued energization of the detector, regardless of the state of conductivity of the electronic control devices, it advantageously connected across the leads of the supply network in series with a current-limiting device, more specifically a constant-current unit as in U.S. Pat. No. 3,932,803. A decoupling diode is inserted in that system between the storage capacitor and the ancillary thyristor (or other electronic switch constituting the aforementioned second control device), triggerable by the detector, activating the main thyristor (or other electronic switch representing the first control device) whose conduction raises the load current to its maximum value. The operating circuit lying between the anode and the gate of the main thyristor includes an impedance, preferably an electronic breakdown device such as a Zener diode, delaying the firing of the main thyristor after the ancillary thyristor has been triggered. During this brief delay period, the conduction of the ancillary thyristor recharges the storage capacitor through the decoupling diode while the constant-current unit is practically short-circuited by that conduction. A stabilizing resistor inserted between the gate and the cathode of the main thyristor lies in series with the aforedescribed operating circuit to limit the flow of gate current in that thyristor. The firing of the main thyristor virtually short-circuits the series combination of ancillary thyristor, Zener diode and stabilizing resistor so that the latter thyristor ceases to conduct. With pulsating or raw-rectified current supplied by the source, the main thyristor is also cut off at the end of each pulsation during which it has been rendered conductive; this results in a periodic recharging of the storage capacitor at the beginning of each new half-cycle (or full cycle in the case of half-wave rectification).

In the system just referred to, as well as in those of the above-identified prior patents wherein a storage capacitor shunted by a charge-limiting electronic breakdown device such as a Zener diode is charged through a constant-current unit, the breakdown device draws practically the full output current of the constant-current unit upon becoming conductive when the storage capacitor reaches a predetermined threshold voltage. This current flow is generally considerably greater than would be necessary in order to maintain conduction of the breakdown device until the capacitor charge has decayed below the sustaining level. It therefore constitutes a wasteful expenditure of energy and may also lead to objectionable heating of the load which lies effectively in series with the breakdown device. In a binary switching system, in which the load is to be in a state of minimum energization when the main or output thyristor is cut off, the existence of a large load current in the quiescent state is especially undesirable.

Another copending application, Ser. No. 786,805 filed Apr. 12, 1977 by Robert Buck, now U.S. Pat. No. 4,100,479, describes and claims a further improvement through which the sustaining current drawn by a conductive charge-limiting electronic breakdown device is minimized. According to this latter improvement, a system of the general type described and claimed in U.S. Pat. No. 3,932,803 is modified by connecting an electronic breakdown device such as a Zener diode between one of the output leads of the direct-current source, i.e. a lead which has an extension included in the energizing circuit for the motion detector, and a control input of a constant-current unit normally supplying charging current to a storage capacitor in series therewith, this Zener diode being nonconductive as long as the charging voltage of the capacitor lies below a predetermined level. When that level is reached, the voltage across the Zener diode equals its breakdown threshold whereupon that diode conducts and establishes a reference potential which, together with the rising capacitor voltage, throttles—possibly down to complete cutoff—the flow of charging current into the capacitor while drawing a reduced sustaining current from a section of the constant-current unit which lies between that control unit and the other lead of the d-c source.

Advantageously, and also disclosed in U.S. Pat. No. 3,932,803, a constant-current unit for the charging of a storage capacitor in the presence of widely varying supply voltages (ranging, for example, between 40 and 250 V) comprises two parallel impedance branches, one of these branches including a transistor serving as an analog-type current regulator while the other branch comprises a voltage divider with a tap tied to the base of this current-regulating transistor. In such a system, this tap constitutes the aforementioned control input of the constant-current unit whereby the sustaining current for the charge-limiting Zener diode is drawn only through one or more resistors forming part of the voltage divider; with the emitter of this transistor connected to the storage capacitor (usually through a resistance), this emitter-follower connection progressively reduces the conductivity of the transistor once the Zener threshold has been exceeded.

Even with the improvements first disclosed in the aforementioned copending applications, however, the load in its quiescent state is still traversed by a significant current drawn by a pilot transistor, or equivalent electronic switch, which is cut off by the oscillator only when the variable-impedance means in series with the source and the load is to be made highly conductive by the triggering of a thyristor or the like forming part thereof. In earlier systems, including that of U.S. Pat. No. 3,932,803, this pilot transistor is shown connected across the two supply leads in series with a resistor which limits but obviously does not cut off the current flow therethrough in the quiescent state.

A further improvement, designed to eliminate this parasitic current flow in the state of minimum energization of the load, is the subject matter of copending application Ser. No. 787,496 filed Apr. 14, 1977 by Robert Buck, now U.S. Pat. No. 4,117,393. That system comprises electronic switch means, specifically a pilot transistor, connected between an input electrode (gate) of an ancillary thyristor or other electronic control device and a supply lead which does not form part of the energizing circuit for the detector, i.e. the lead—hereinafter assumed to be positive—which is connected to the storage capacitor via current-limiting means such as a high-ohmic resistor or, preferably, a constant-current unit. The input circuitry of the pilot transistor or equivalent electronic switch means, connected to the detector, cuts off that switch means under conditions of minimum energization of the load, thus when the output thyristor or other control device in series with the load is in its high-resistance state. The connection between the positive supply lead and the pilot transistor includes a portion of the current-limiting means forming part of the voltage-generating network through which the storage capacitor of this network is charged. If the current-limiting means is a constant-current unit, as in the system of the aforementioned U.S. Pat. No. 4,100,479, that portion advantageously comprises a current-regulating transistor in a branch of this unit whose base is tied to a tap on a voltage divider constituting another branch thereof; that tap is preferably connected to the opposite (negative) supply lead through an electronic breakdown device such as a Zener diode for limiting the charging current as described in that copending application, the current-regulating transistor acting as an emitter-follower. In a specific embodiment, a protective transistor complementary to the pilot transistor is connected in cascade with the latter transistor, and with the current-regulating transistor of the constant-current unit, between the input electrode (gate) of the electronic control device and the opposite (negative) supply lead for positively preventing untimely conduction of that control device. For this purpose the operating circuit for the control device drives the two complementary transistors via inversion means so as to cut off the pilot transistor whenever the protective transistor conducts, and vice versa.

OBJECT OF THE INVENTION

The object of our present invention is to provide a further simplification of the monitoring system described in the above-identified applications and patents, with elimination of a second thyristor or equivalent control device.

SUMMARY OF THE INVENTION

We realize this object, in accordance with our present invention, by providing the remaining thyristor or equivalent electronic control device—connected in parallel with the voltage-generating network which includes the storage capacitor and the current-limiting means in series—with an operating circuit connected across the storage capacitor, this operating circuit comprising normally nonconductive electronic switch means inserted between the storage capacitor and an input electrode of the control device, specifically a gate of the thyristor. The normally nonconductive switch means may be a Zener diode which becomes conductive upon the application of a suitable potential difference thereacross, a transistor turned on by a trigger signal, or a combination of both. In either case, a switchover of the control device (referred to hereinafter, for convenience, as a thyristor) from its normal high-impedance state to a low-impedance state is prevented in the absence of conduction of the electronic switch means which advantageously forms part of a voltage divider having a tap connected to the thyristor gate.

According to a more particular feature of our invention, the trigger means designed to render the electronic switch means conductive to fire the thyristor comprises a pilot transistor connected between the storage capacitor and the supply lead (assumed hereinafter to be positive) not directly connected to that capacitor. Though the function of this pilot transistor differs significantly from that of the pilot transistor of the aforementioned U.S. Pat. No. 4,117,393 (i.e. the firing of an auxiliary thyristor as discussed above), its connection to that positive supply lead preferably also includes a portion of the current-limiting means in order to control the current flow through the pilot transistor.

Our invention further provides for various measures to prevent untimely firing, e.g. in response to sudden changes in the supply voltage. One of these measures comprises the combination of a pilot transistor with a protective transistor included in the gate circuit of the thyristor as part of the aforementioned electronic switch means.

BRIEF DESCRIPTION OF THE DRAWING

The above and other features of our invention will now be described in detail with reference to the accompanying drawing in which.

SPECIFIC DESCRIPTION

Figure 1:
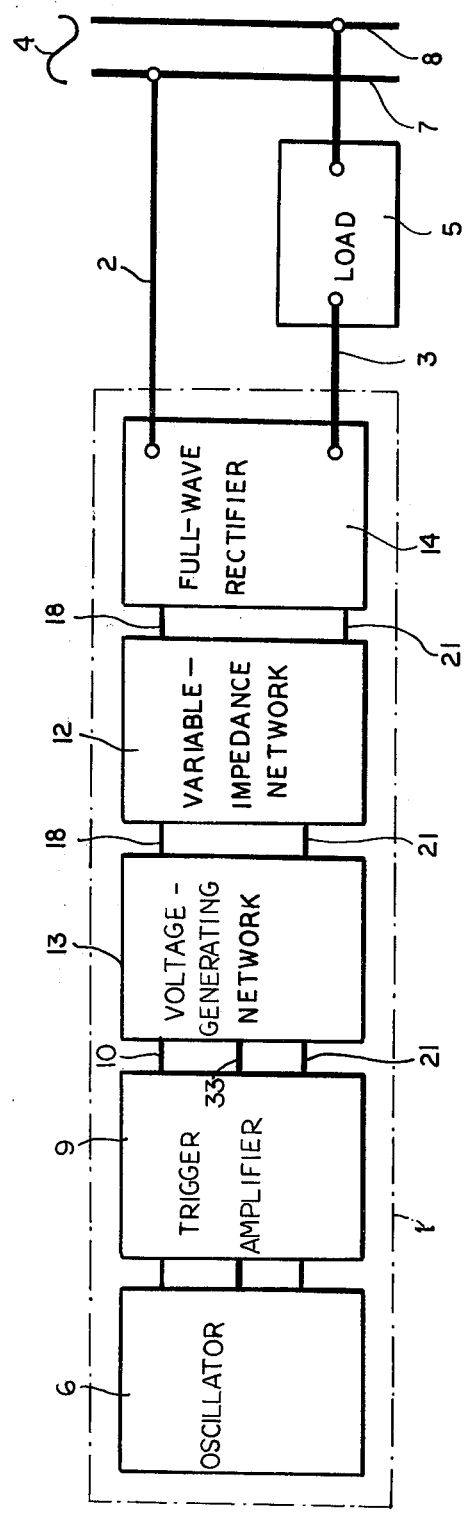
FIG. 1 is a block diagram of an electronic monitoring system according to our invention.

FIG. 1 shows the basic components of a monitoring system embodying our invention, namely an oscillator 6 and a trigger amplifier 9 together constituting a detector, a current-responsive load 5 such as a relay in a supply circuit whose two conductors 2, 3 are connected via respective bus bars 7, 8 across an a-c source 4, a full-wave rectifier 14 inserted between the supply conductors 2, 3 and a pair of leads 18, 21 extending to a variable-impedance network 12 whose impedance controls the load current in response to signals from oscillator 6, and a voltage-generating network 13 also receiving the output of rectifier 14 by way of leads 18 and 21. Network 13 is connected to amplifier 9 by leads 10 and 33 as well as an extension of lead 21 which, with lead 10, is part of an energizing circuit supplying the detector stages 6 and 9 with operating voltage; supply leads 18 and 21 are the positive and negative output leads of d-c source 4, 14. Components 6,9, 12, 13 and 14 form part of a proximity sensor 1 of the general type described in the aforementioned U.S. patents, particularly U.S. Pat. No. 3,932,803 whose disclosure is hereby incorporated by reference into the present application.

Figure 2:
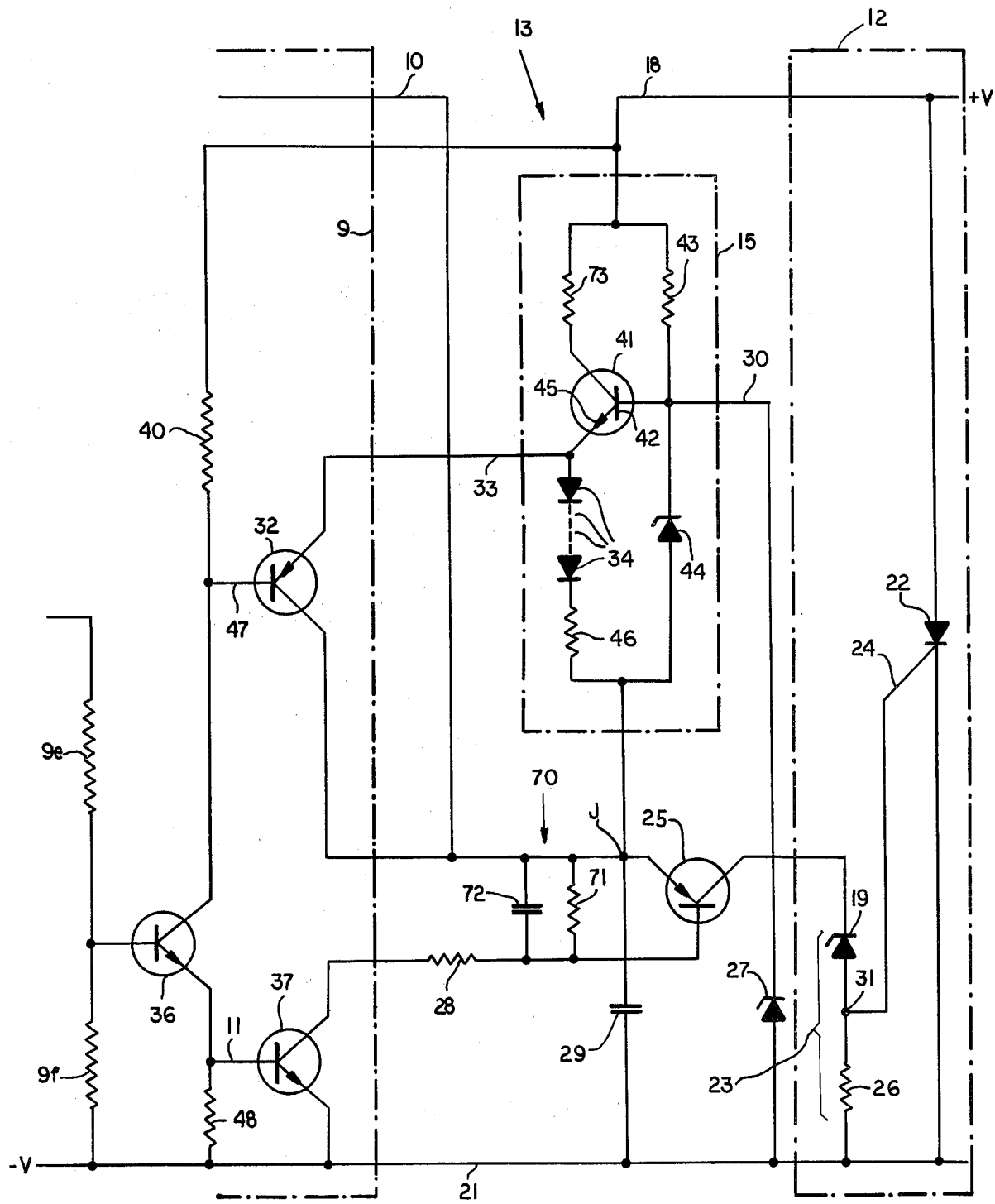
FIG. 2 is a more detailed circuit diagram of a variable-impedance network included in the system of FIG. 1, embodying the present invention.

In FIG. 2 we have shown only the components 12 and 13 as well as part of component 9 of the system of FIG. 1 inasmuch as the remainder of the system conforms to the illustration of U.S. Pat. No. 3,932,803. Component 12 comprises a binary electronic device in the form of a thyristor 22 with an anode tied to positive supply lead 18 carrying pulsating voltage +V, a cathode connected to the opposite supply lead 21 carrying negative voltage −V, and an output electrode or gate connected to a lead 24. Negative lead 21, which is common to all the components, could be grounded if desired. Component 13 includes a storage capacitor 29 forming a junction J with a current limiter 15, the network 15, 29 being connected in parallel with thyristor 22 between supply leads 18 and 21. Current limiter 15 is of the type disclosed in commonly owned U.S. Pat. No. 4,117,393 referred to above and includes a current-regulating transistor 41 of NPN type having its collector tied to lead 18 by way of a resistor 73 and having its emitter connected to junction J through a resistor 46 in series with a stack of diodes 34 establishing a substantially constant voltage drop thereacross. This branch of unit 15 is shunted by a voltage divider comprising a resistor 43 in series with a Zener diode 44 whose cathode is connected to the base of transistor 41 and also, through another Zener diode 27, to lead 21. Zener diode 44 breaks down before Zener diode 27 and maintains a substantially constant voltage difference between the base 42 and the emitter 45 of transistor 41 whose conduction charges the capacitor 29 at a relatively rapid rate until Zener diode 27 conducts and stabilizes the potential of base 42 at a fixed value (e.g. of about 6 V) with reference to that of lead 21. As the potential of junction J approaches that of lead 30, Zener diode 44 is cut off to throttle the current flow through unit 15 which thereupon passes only a residual charging current besides the small sustaining current for Zener diode 27 traversing the resistor 43. That residual charging current is designed to maintain the energization of detector stages 6 and 9 (see FIG. 1) by way of lead 10 branching off junction J.

Storage capacitor 29 is shunted by an operating circuit for thyristor 22 which comprises a protective transistor 25 in series with a voltage divider 23 constituted by a Zener diode 19 and a resistor 26. A tap 31 of that voltage divider, lying between Zener diode 19 and resistor 26, is tied to the gate lead 24. With transistor 25 cut off, no current can flow through that divider to fire the thyristor 22.

The circuitry for triggering the thyristor 22 includes, besides protective transistor 25, a monitoring pilot transistor 32 of PNP type having its emitter tied to emitter 45 of transistor 41 and having its collector connected to junction J. An ancillary transistor 37 of NPN type has its emitter tied to lead 21 and its collector connected through a resistor 28 to the base of protective transistor 25. An integrating network 70, consisting of a resistor 71 in parallel with a condenser 72, shunts the input circuit of transistor 25 to form a bypass for high-frequency transients in order to prevent untimely conduction of that transistor.

The base of transistor 37 is connected, through a lead 11, to the emitter of an NPN switching transistor 36 whose collector is connected, via a lead 47, to the base of transistor 32 and through a resistor 40 to supply lead 18. The base of transistor 36 is joined to a common terminal of two series resistors 9e and 9f forming a voltage divider as shown in U.S. Pat. No. 3,932,803. A resistor 48 lies between leads 11 and 21.

With transistor 36 nonconductive, transistors 32 and 37 are also cut off. This situation occurs when resistors 9e and 9f are not traversed by current, in one of the two operating states of detector 6 and amplifier 9. In the other operating state, all three transistors 32, 36 and 37 are saturated; transistor 25 also becomes conductive as its base voltage is lowered to less than the charging voltage of capacitor 29. The combined resistance of resistors 28 and 71 must, of course, be high enough to prevent an excessive discharge of capacitor 29. With transistor 32 now practically short-circuiting the connection between junction J and emitter 45, the capacitor charge is boosted as the current flow through resistor 73 increases. The resulting voltage rise of junction J, coupled with the conduction of transistor 25, breaks down the Zener diode 19 so that tap 31 is driven positive with reference to lead 21 and thyristor 22 is fired. A large load current is now drawn through supply circuit 18, 21 so that relay 5 (FIG. 1) operates to indicate the response of detector 6, 9. Aside from rectifier 14 and the internal resistance of source 4, only the small resistance of the conductive thyristor 22 lies at this point in series with the load. Relay 5 may be sufficiently slow-releasing to remain operated between current pulses when thyristor 22 is cut off. If the detected off-normal condition persists, the thyristor is retriggered at the beginning of the next half-cycle; capacitor 29 briefly recharges through unit 15 and transistor 32 before any new breakdown of Zener diode 19. For the described system it is immaterial whether the switching transistor 36 becomes conductive upon a changeover from or to the normal operating condition of oscillator 6, i.e. whether the relay 5 is actuated upon the approach or the removal of a metallic element influencing that oscillator.

As will be apparent from FIG. 2, thyristor 22 could also be triggered by the saturation of protective transistor 25 if pilot transistor 32 were omitted, provided that the thresholds of Zener diodes 19, 27 and 44 were so chosen that capacitor 29 charges above the breakdown voltage of Zener diode 19. The presence of transistor 32, however, insures a more reliable operation of the system.

Figure 3:
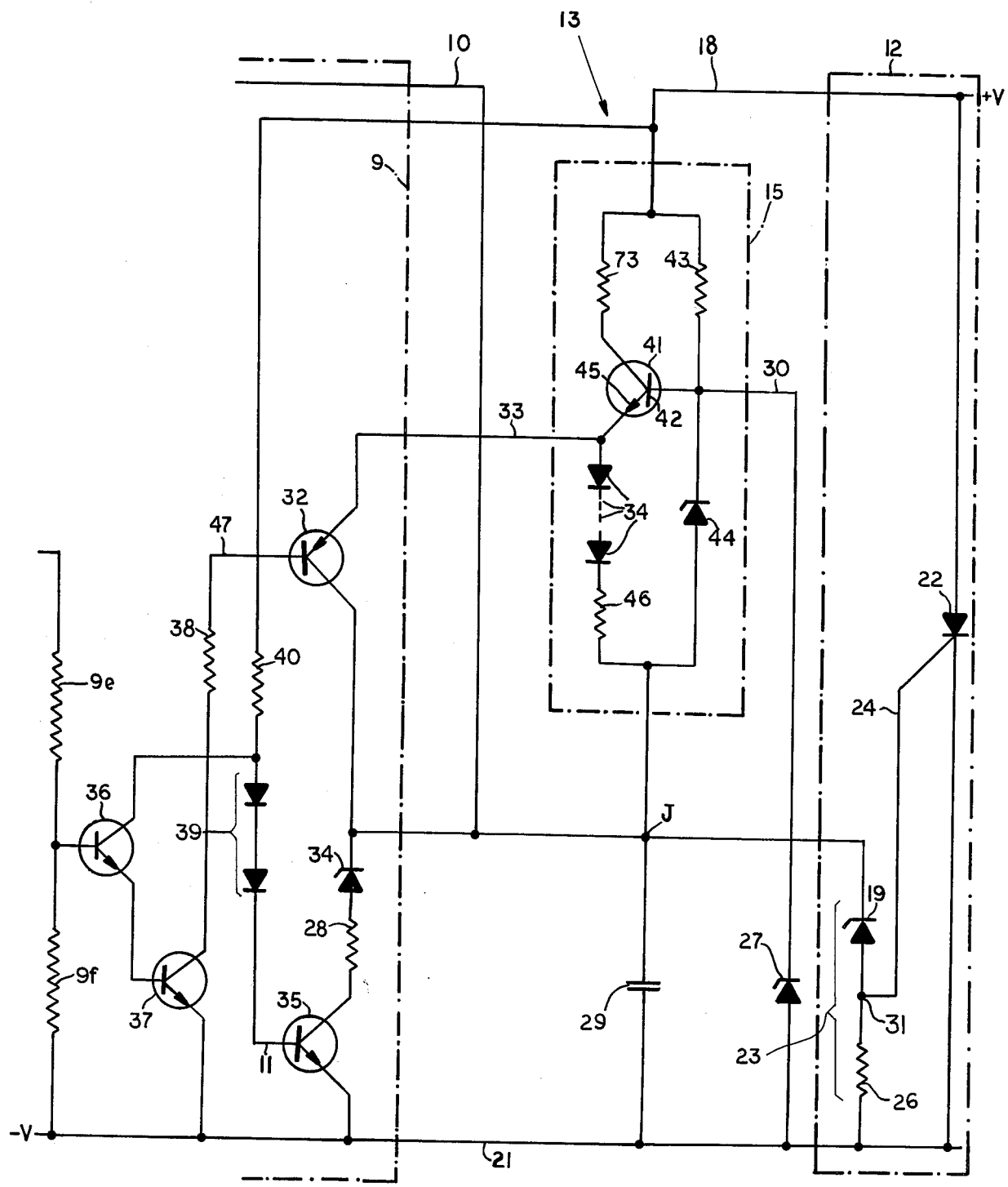
FIGS. 3 and 4 show modifications of the network of FIG. 2.

In FIG. 3 we have shown a modified arrangement with omission of protective transistor 25 and of the associated integrating network 70. Transistor 37 is here paired with transistor 36 in a Darlington connection of the type shown in U.S. Pat. No. 4,117,393 with omission of the resistor 48 of FIG. 2; the collector of transistor 37 is connected via a resistor 38 to the base lead 47 of transistor 32. A stack of diodes 39 connects the collector of transistor 36, as in the last-mentioned patent, to the base lead 11 of an ancillary NPN transistor 35 which is thus driven in opposition to pilot transistor 32 so that the latter saturates when the former is cut off and vice versa. The emitter of transistor 35 is tied to lead 21 whereas its collector is connected through a resistor 28 and a Zener diode 34 to junction J and thus to the collector of transistor 32.

Normally, with switching transistor 36 cut off, ancillary transistor 35 conducts together with Zener diode 34 whose breakdown potential is so chosen as to prevent any substantial rise in the voltage of storage capacitor 29 beyond the charging level established by Zener diodes 27 and 44. In the event of a changeover, current traversing the voltage divider 9e, 9f turns on the Darlington pair 36, 37 to saturate the pilot transistor 32 while cutting off the protective transistor 35. The resulting rise in capacitor voltage breaks down the Zener diode 19 inserted as a binary electronic switch in the operating circuit of thyristor 22 which, therefore, is ignited to actuate the relay 5 of FIG. 1 as described above.

Figure 4:
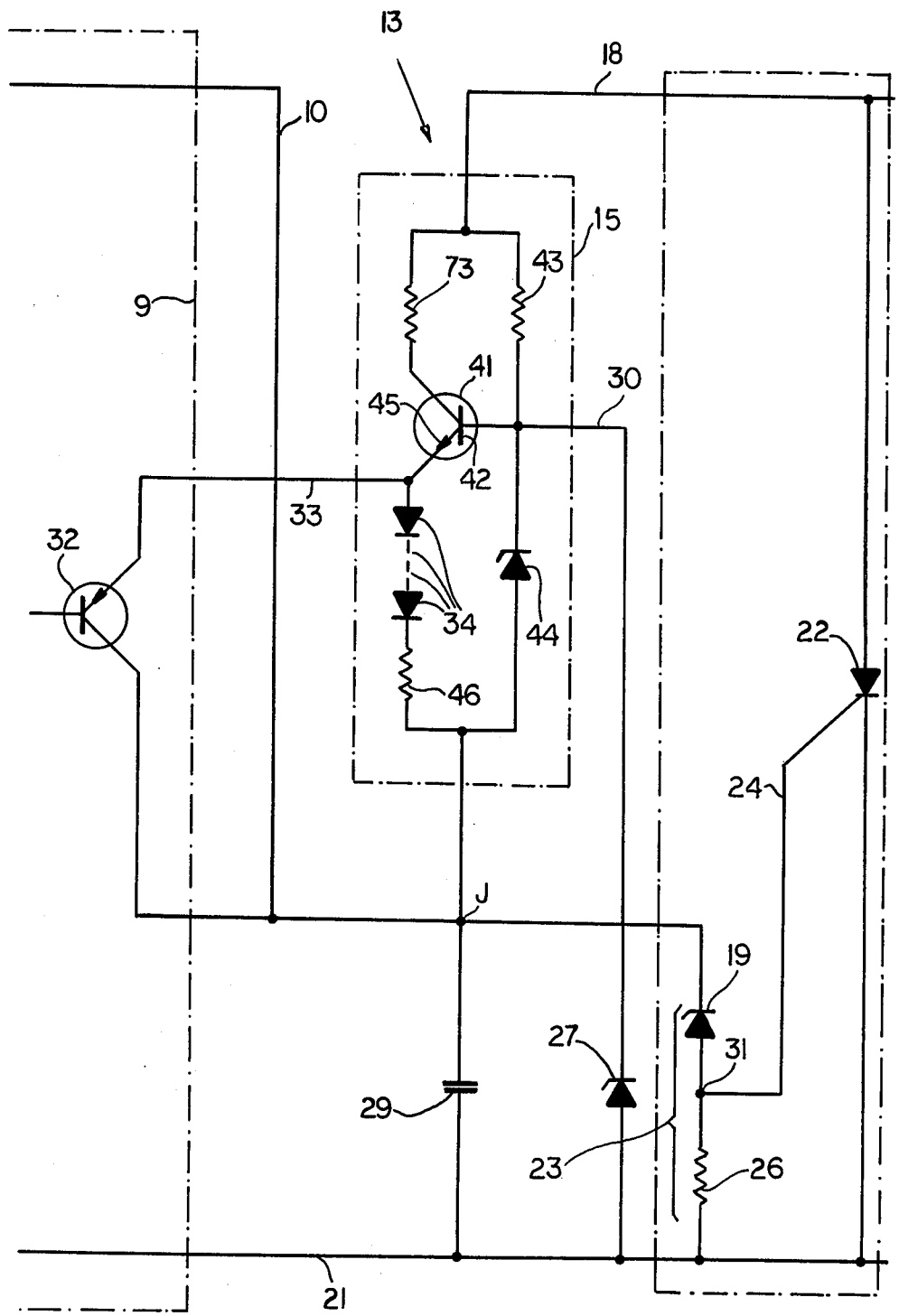

The simplified system of FIG. 4 dispenses with all protective transistors and utilizes only the pilot transistor 32 which may be driven, as before, by a switching transistor such as the one shown at 36 in FIG. 2. Untimely firing of the thyristor 22 is here prevented with a suitable relative selection of the thresholds of Zener diodes 19, 27 and 44 so that Zener diode 19 will not break down during steady-state operation with pilot transistor 32 cut off and with unit 15 delivering a trickle charge to storage capacitor 29. Saturation of transistor 32, extinguishing conduction through Zener diode 44 as in the previous instances, again raises the voltage across capacitor 29 to a level sufficient to energize the voltage divider 23 with resulting ignition of thyristor 22.

Current-regulating transistor 41 could be replaced by an equivalent semiconductive device, e.g. a planar thyristor.

We claim:
1. An electronic monitoring system comprising:
detector means sensitive to an ambient condition for generating an output signal varying with a changeover in said condition, said detector means being provided with a pair of power-input terminals;
a voltage-generating network including a storage capacitor and current-limiting means in series therewith, said terminals being connected across said storage capacitor in an energizing circuit for said detector means;
a source of direct current with a pair of supply leads connected across said network for charging said storage capacitor via said current-limiting means, one of said supply leads having an extension included in said energizing circuit;
a current-responsive load in series with said source and said network;
a binary electronic control device connected in parallel with said network and provided with an operating circuit connected across said storage capacitor, said operating circuit including normally nonconductive electronic switch means between said storage capacitor and an input electrode of said control device for maintaining the latter in a high-impedance state prior to occurrence of said changeover, said electronic switch means comprising a Zener diode forming part of a voltage divider included in said operating circuit, said input electrode being connected to a tap on said voltage divider; and
trigger means responsive to said output signal operatively connected to said electronic switch means for rendering same conductive upon the occurrence of said changeover, thereby converting said control device to a low-impedance state short-circuiting said network.

2. A system as defined in claim 1 wherein said trigger means comprises a pilot transistor connected between said storage capacitor and the other of said supply leads.

3. A system as defined in claim 2 wherein the connection between said pilot transistor and said other of said supply leads includes a portion of said current-limiting means.

4. A system as defined in claim 2 wherein said electronic switch means further comprises a protective transistor in series with said voltage divider, said protective transistor being controlled by said trigger means to conduct simultaneously with said pilot transistor.

5. A system as defined in claim 4 wherein said protective transistor has an input circuit forming a capacitive bypass for transient voltages.

6. A system as defined in claim 2 wherein said trigger means further comprises a normally conductive ancillary transistor in parallel with said storage capacitor connected to become nonconductive upon conduction of said pilot transistor.

7. A system as defined in claim 6, further comprising another Zener diode connected in series with said ancillary transistor across said storage capacitor.

8. An electronic monitoring system comprising:
detector means sensitive to an ambient condition for generating an output signal varying with a changeover in said condition, said detector means being provided with a pair of power-input terminals;
a voltage-generating network including a storage capacitor and current-limiting means in series therewith, said terminals being connected across said storage capacitor in an energizing circuit for said detector means;

a source of direct current with a pair of supply leads connected across said network for charging said storage capacitor via said current-limiting means, one of said supply leads having an extension included in said energizing circuit;

a current-responsive load in series with said source and said network;

a binary electronic control device connected in parallel with said network and provided with an operating circuit connected across said storage capacitor, said operating circuit including normally nonconductive electronic switch means between said storage capacitor and an input electrode of said control device for maintaining the latter in a high-impedance state prior to occurrence of said changeover; and trigger means responsive to said output signal operatively connected to said electronic switch means for rendering same conductive upon the occurrence of said changeover, thereby converting said control device to a low-impedance state short-circuiting said network, said electronic switch means comprising a transistor controlled by said trigger means, said transistor forming part of a voltage divider included in said operating circuit, said input electrode being connected to a tap on said voltage divider.

9. A system as defined in claim 8 wherein said voltage divider further includes a Zener diode and a resistance in series with said transistor.

10. A system as defined in claims 1, 2, 8, or 9 wherein said control device is a thyristor, said input electrode being a gate.

* * * * *